US010586951B2

(12) United States Patent
Shimogawara et al.

(10) Patent No.: US 10,586,951 B2
(45) Date of Patent: Mar. 10, 2020

(54) METHOD OF MANUFACTURING ORGANIC EL ELEMENT

(71) Applicant: SUMITOMO CHEMICAL COMPANY, LIMITED, Tokyo (JP)

(72) Inventors: Masaya Shimogawara, Niihama (JP); Shinichi Morishima, Tsukuba (JP); Masato Shakutsui, Niihama (JP); Eiji Kishikawa, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/764,673

(22) PCT Filed: Sep. 26, 2016

(86) PCT No.: PCT/JP2016/078199
§ 371 (c)(1),
(2) Date: Mar. 29, 2018

(87) PCT Pub. No.: WO2017/057240
PCT Pub. Date: Apr. 6, 2017

(65) Prior Publication Data
US 2018/0287100 A1 Oct. 4, 2018

(30) Foreign Application Priority Data

Sep. 30, 2015 (JP) .................. 2015-193098

(51) Int. Cl.
*H01L 21/00* (2006.01)
*H01L 51/56* (2006.01)
(Continued)

(52) U.S. Cl.
CPC .......... *H01L 51/56* (2013.01); *H01L 51/0023* (2013.01); *H01L 51/5209* (2013.01);
(Continued)

(58) Field of Classification Search
CPC . H01L 51/56; H01L 51/0023; H01L 51/5253; H01L 51/5225; H01L 51/5209;
(Continued)

(56) References Cited

U.S. PATENT DOCUMENTS 5,882,761 A 3/1999 Kawami et al.
6,590,335 B1 7/2003 Nagayama
(Continued)

FOREIGN PATENT DOCUMENTS

CN 102210193 A 10/2011
JP 9148066 A 6/1997
(Continued)

OTHER PUBLICATIONS

International Search Report dated Nov. 22, 2016 from the International Bureau in counterpart International application No. PCT/JP2016/078199.
(Continued)

*Primary Examiner* — Vu A Vu
(74) *Attorney, Agent, or Firm* — Sughrue Mion, PLLC

(57) ABSTRACT

A method of manufacturing an organic EL element (1) includes: a step of forming a first electrode layer (5), an organic functional layer (7), and a second electrode layer (9) on a substrate (3), a step of detecting a defective portion after forming the second electrode layer (9), a step of removing the second electrode layer (9) in the defective portion by irradiating the defective portion with a laser beam (L) from the second electrode layer (9) side when the defective portion has been detected, and a step of forming a sealing layer (11) after removing the second electrode layer 9 in the defective portion.

9 Claims, 6 Drawing Sheets

(51) Int. Cl.
  *H05B 33/10* (2006.01)
  *H05B 33/12* (2006.01)
  *H05B 33/02* (2006.01)
  *H05B 33/28* (2006.01)
  *H05B 33/04* (2006.01)
  *H01L 51/00* (2006.01)
  *H01L 51/52* (2006.01)

(52) U.S. Cl.
  CPC ......... *H01L 51/5253* (2013.01); *H05B 33/02* (2013.01); *H05B 33/04* (2013.01); *H05B 33/10* (2013.01); *H05B 33/12* (2013.01); *H05B 33/28* (2013.01); *H01L 51/524* (2013.01); *H01L 51/5225* (2013.01); *H01L 2251/5392* (2013.01); *H01L 2251/568* (2013.01)

(58) Field of Classification Search
  CPC . H01L 51/50; H01L 2251/5392; H05B 33/28; H05B 33/12; H05B 33/10; H05B 33/04; H05B 33/02
  USPC .......................................................... 438/26
  See application file for complete search history.

(56) References Cited

U.S. PATENT DOCUMENTS

| | | | | |
|---|---|---|---|---|
| 7,871,930 | B2* | 1/2011 | Yamagata | H01L 51/52 438/688 |
| 8,772,052 | B2* | 7/2014 | Miyazawa | H01L 27/322 438/4 |
| 2002/0142697 | A1 | 10/2002 | Yamagata et al. | |
| 2002/0180372 | A1 | 12/2002 | Yamazaki | |
| 2005/0023523 | A1 | 2/2005 | Kawaguchi et al. | |
| 2005/0196892 | A1 | 9/2005 | Yamagata et al. | |
| 2007/0141942 | A1 | 6/2007 | Kawaguchi et al. | |
| 2011/0278603 | A1 | 11/2011 | Miyazawa et al. | |
| 2012/0164761 | A1 | 6/2012 | Yamazaki et al. | |
| 2012/0196388 | A1 | 8/2012 | Tanaka | |
| 2012/0244643 | A1 | 9/2012 | Yamazaki | |
| 2014/0139253 | A1 | 5/2014 | Arita et al. | |
| 2014/0166990 | A1* | 6/2014 | Ma | H01L 51/56 257/40 |
| 2014/0320769 | A1* | 10/2014 | Masuda | G06F 3/044 349/12 |

FOREIGN PATENT DOCUMENTS

| | | |
|---|---|---|
| JP | 2001-118684 A | 4/2001 |
| JP | 2003257634 A | 9/2003 |
| JP | 2005032576 A | 2/2005 |
| JP | 2007012357 A | 1/2007 |
| JP | 201171143 A | 4/2011 |
| JP | 2011134489 A | 7/2011 |
| JP | 2012084371 A | 4/2012 |
| JP | 2012151104 A | 8/2012 |
| JP | 2012216514 A | 11/2012 |
| WO | 2012172938 A1 | 12/2012 |

OTHER PUBLICATIONS

International Preliminary Report on Patentability with the translation of Written Opinion dated Apr. 12, 2018 issued by the International Bureau in No. PCT/JP2016/078199.
Communication dated Mar. 7, 2019 from the China National Intellectual Property Administration in application No. 201680056254.2.
Extended European Search Report dated May 22, 2019 issued by the European Patent Office in counterpart application No. 16851411.5.
Communication dated Jun. 25, 2019 from the Japanese Patent Office in application No. 2015-193098.
Communication dated Oct. 23, 2019 by the China National Intellectual Property Administration in application No. 201680056254.2.
Communication dated Nov. 26, 2019, from the Japanese Patent Office in counterpart application No. 2015-193098.

* cited by examiner

METHOD OF MANUFACTURING ORGANIC EL ELEMENT

CROSS REFERENCE TO RELATED APPLICATIONS

This application is a National Stage of International Application No. PCT/JP2016/078199 filed Sep. 26, 2016, claiming priority based on Japanese Patent Application No. 2015-193098 filed Sep. 30, 2015, the disclosure of which are incorporated herein by reference.

TECHNICAL FIELD

The invention relates to a method of manufacturing an organic EL element.

BACKGROUND ART

An organic EL element in which a first electrode layer, an organic functional layer including a light emitting layer, a second electrode layer, and a sealing layer are stacked on a support substrate in this order is known (for example, see Patent Literature 1).

CITATION LIST

Patent Literature

Patent Literature 1: Japanese Unexamined Patent Application Publication No. H9-148066

SUMMARY OF INVENTION

Technical Problem

In a conventional method of manufacturing an organic EL element, when a defect (a pixel defect) has occurred due to a short circuit between a first electrode layer and a second electrode layer, the second electrode layer in a defective portion is irradiated with a laser beam from the first electrode layer side to remove the second electrode layer. Accordingly, the first electrode layer and the second electrode layer are electrically isolated from each other to remove the short circuit between the first electrode layer and the second electrode layer.

Here, the first electrode layer may include a conductor having a network structure. In an organic EL element including such a first electrode layer, when a laser beam is applied from the first electrode layer side to remove a defective portion of the second electrode layer using a laser, the laser beam may be reflected by the conductor having a network structure. Accordingly, when an organic EL element including the first electrode layer with a network structure is manufactured, there is concern that a defective portion of the second electrode layer will not be irradiated with a laser beam due to reflection of the laser beam by the conductor and the second electrode layer in the defective portion will not be able to be removed. Accordingly, in the conventional method of manufacturing an organic EL element, there may be a problem in that a defective portion cannot be corrected.

An aspect of the invention provides a method of manufacturing an organic EL element that can satisfactorily correct a defective portion.

Solution to Problem

A method of manufacturing an organic EL element according to an aspect of the invention is a method of manufacturing an organic EL element in which a substrate, a first electrode layer having a conductor with a network structure, an organic functional layer, a second electrode layer, and a sealing layer including an opaque substrate are arranged in this order, the method including: a step of forming the first electrode layer, the organic functional layer, and the second electrode layer on the substrate; a step of detecting a defective portion due to a short circuit between the first electrode layer and the second electrode layer after forming the second electrode layer; a step of removing the second electrode layer in the defective portion by irradiating the defective portion with a laser beam from the second electrode layer side when the defective portion has been detected; and a step of forming the sealing layer after removing the second electrode layer in the defective portion.

In the method of manufacturing an organic EL element according to the aspect of the invention, a part of the second electrode layer is removed by irradiating the second electrode layer in the defective portion with a laser beam before forming the sealing layer including an opaque substrate. At this time, the laser beam is applied from the second electrode layer side. Accordingly, in the manufacturing method, a situation in which the laser beam is reflected by the conductor of the first electrode layer having a network structure and the second electrode layer in the defective portion is not irradiated with the laser beam does not occur. Accordingly, the second electrode layer in the defective portion can be appropriately irradiated with a laser beam and the second electrode layer can be satisfactorily removed. As a result, according to the method of manufacturing an organic EL element, it is possible to satisfactorily correct a defective portion.

In one embodiment, the first electrode layer in which the conductor has a lattice-shaped pattern may be formed. When the conductor constituting a network structure has a lattice-shaped pattern and a laser beam is applied from the first electrode layer side, there is a high likelihood that the laser beam will be reflected by the conductor. Accordingly, the method of applying a laser beam from the second electrode layer side is particularly effective in a network structure with a lattice-shaped pattern.

In one embodiment, the first electrode layer may be formed using a material having a melting point higher than that of a material of the second electrode layer. In one embodiment, the first electrode layer may be formed using a material having a boiling point higher than that of a material of the second electrode layer. According to these configurations, it is possible to curb damage to the first electrode layer due to irradiation with a laser beam. Accordingly, it is possible to prevent a decrease in reliability of an EL organic element.

In one embodiment, the substrate may have flexibility, and the steps may be performed while continuously conveying the substrate. Since the substrate has flexibility, a roll-to-roll process of performing processing while conveying the substrate can be employed. Accordingly, it is possible to efficiently perform the steps.

In one embodiment, the defective portion may be detected in the step of detecting the defective portion by pinching the substrate, the first electrode layer, and the second electrode layer using a support unit that supports the substrate and an application unit that applies a voltage to the first electrode layer and the second electrode layer and causing the organic functional layer to emit light. Accordingly, in the step of inspecting for defects, for example, the substrate having flexibility can be supported without being bent. Since the substrate, the first electrode layer, and the second electrode layer are pinched by the support unit and the application unit, a voltage can be satisfactorily applied to the first electrode layer and the second electrode using the application unit. Accordingly, it is possible to satisfactorily cause the organic functional layer to emit light and to inspect for a defective portion satisfactorily.

In one embodiment, the substrate may be a film having a barrier layer or a thin-film glass.

In one embodiment, an environmental dew point when the second electrode layer is irradiated with the laser beam may be equal to or lower than −50° C. In this way, by irradiating the second electrode layer with a laser beam in an atmosphere of dry air, it is possible to remove the second electrode layer satisfactorily.

In one embodiment, the second electrode layer and a part of the organic functional layer in the defective portion may be removed using the laser beam. Accordingly, the second electrode layer in the defective portion is satisfactorily removed. Accordingly, it is possible to satisfactorily insulate the first electrode layer and the second electrode layer from each other and to satisfactorily correct a defective portion due to a short circuit.

In one embodiment, the second electrode layer may be irradiated with the laser beam from a lower side in a state in which the second electrode layer is located below the substrate. Accordingly, substance removed by irradiation with a laser beam can drop down. As a result, it is possible to prevent removed substrate from remaining in the removed portion of the second electrode layer.

Advantageous Effects of Invention

According to an aspect of the invention, it is possible to satisfactorily correct a defective portion.

DESCRIPTION OF EMBODIMENTS

Hereinafter, exemplary embodiments of the invention will be described in detail with reference to the accompanying drawings. In description with reference to the drawings, the same or corresponding elements will be referenced by the same reference signs and description thereof will not be repeated.

Figure 1:
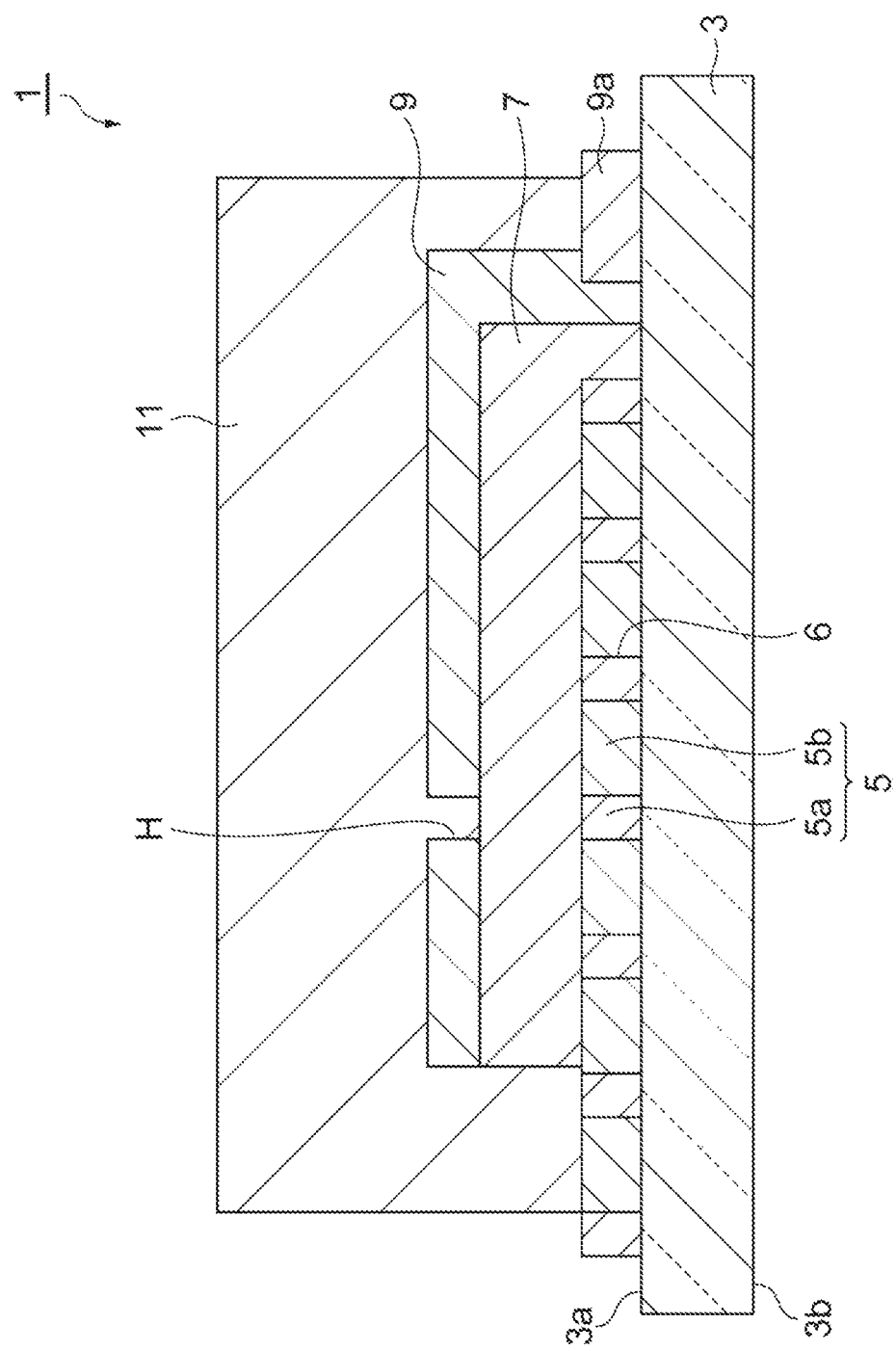
FIG. 1 is a sectional view of an organic EL element which is manufactured using a method of manufacturing an organic EL element according to an embodiment of the invention.

As illustrated in FIG. 1, an organic EL element 1 that has been manufactured in accordance with a method of manufacturing an organic EL element includes a support substrate (a substrate) 3, a positive electrode layer (a first electrode layer) 5, a light emitting layer (an organic functional layer) 7, a negative electrode layer (a second electrode layer) 9, and a sealing layer 11. In the organic EL element 1, the support substrate 3, the positive electrode layer 5, the light emitting layer 7, the negative electrode layer 9, and the sealing layer 11 are arranged in this order.

[Support Substrate]

The support substrate 3 is formed of a resin having a light transmitting property with respect to visible light (light with a wavelength of 400 nm to 800 nm). The support substrate 3 is a film-shaped substrate (a flexible substrate, a substrate having flexibility). The thickness of the support substrate 3 is, for example, equal to or greater than 30 μm and equal to or less than 500 μm.

The support substrate 3 is, for example, a plastic film. Examples of the material of the support substrate 3 include polyether sulfone (PES); a polyester resin such as polyethylene terephthalate (PET) or polyethylene naphthalate (PEN); a polyolefin resin such as polyethylene (PE), polypropylene (PP), or a cyclic polyolefin; a polyamide resin; a polycarbonate resin; a polystyrene resin; a polyvinyl alcohol resin; a saponified product of a ethylene vinyl acetate copolymer; a polyacrylonitrile resin; an acetal resin; a polyimide resin; and an epoxy resin.

From the viewpoint of high heat resistance, a low linear expansion coefficient, and a low manufacturing cost, a polyester resin and a polyolefin resin among the above-mentioned resins are preferably used as the material of the support substrate 3, and a polyethylene terephthalate and polyethylene naphthalate are particularly preferably used. These resins may be used alone or in combination of two or more types thereof.

A moisture barrier layer (a barrier layer) may be disposed on one principal surface 3a of the support substrate 3. The other principal surface 3b of the support substrate 3 is a light emitting surface. The support substrate 3 may be thin-film glass.

[Positive Electrode Layer]

Figure 2:
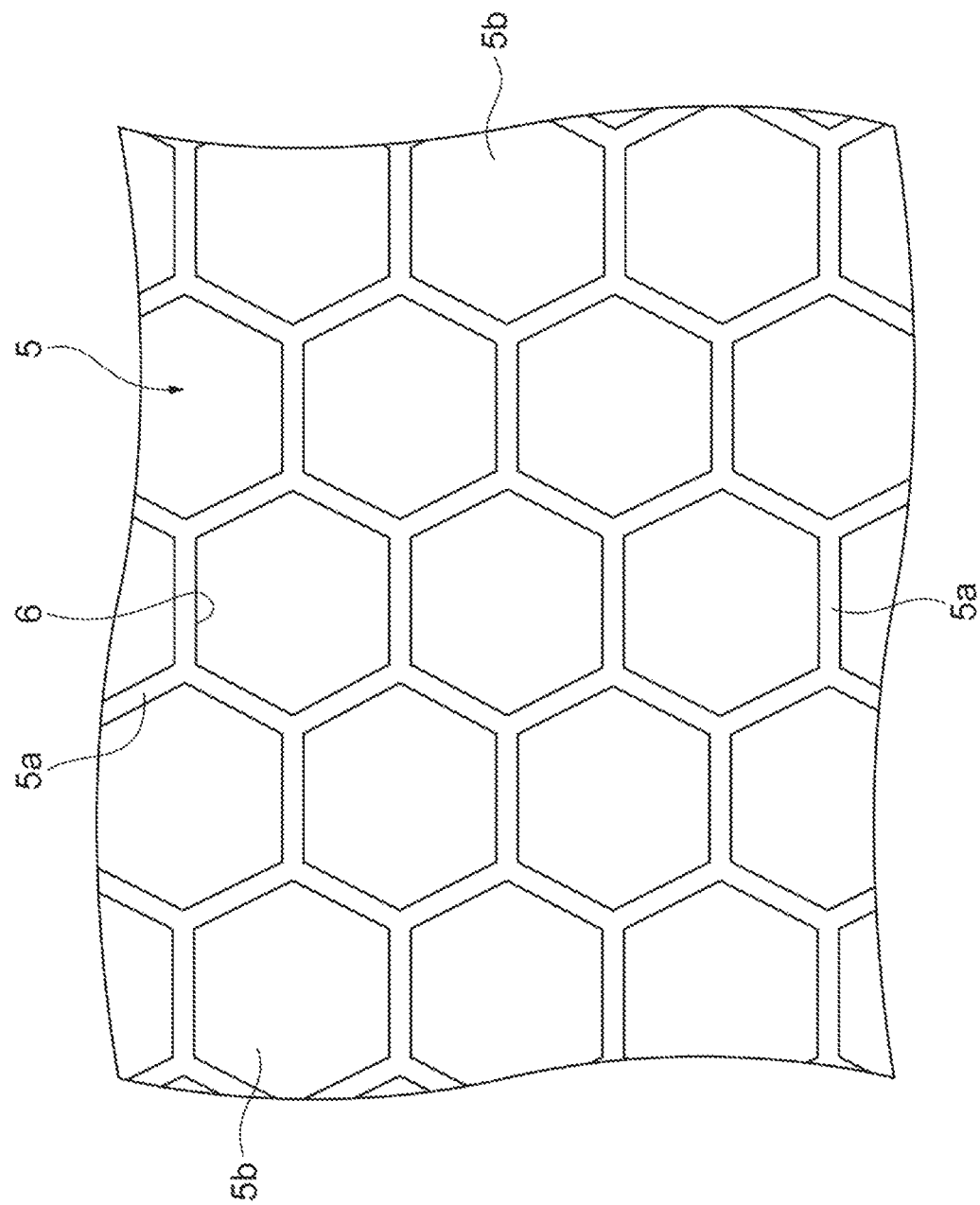
FIG. 2 is a diagram illustrating a configuration of a positive electrode layer.

The positive electrode layer 5 has a network structure formed of a conductor. As illustrated in FIGS. 1 and 2, the positive electrode layer 5 includes a metal wire (a conductor) 5a and a transparent resin filler 5b. The metal wire 5a is formed of a conductor and constitutes a network structure. For example, the material of the metal wire 5a may be selected from silver, aluminum, copper, palladium, gold, nickel, iron, molybdenum, and chromium or selected from alloys (for example, molybdenum-aluminum-molybdenum (MAM)) including one or more of these metals.

The metal wire 5a is formed in a predetermined pattern having a plurality of opening portions 6 (or window portions). The predetermined pattern may be, for example, a lattice-shaped pattern as illustrated in FIG. 2. In the case of a lattice-shaped pattern, a plurality of opening portions 6 correspond to a mesh. Examples of the shapes in the mesh include a quadrangular shape such as a rectangular shape or a square shape, a triangular shape, and a hexagonal shape. The shape of the predetermined pattern is not particularly limited as long as the metal wire 5a has a network structure.

The transparent resin filler 5b fills each of the plurality of opening portions 6 and plugs the opening portions 6. The thickness of the transparent resin filler 5b is substantially equal to the thickness of the metal wire 5a. For example, polymerizable resin compounds described in Japanese Unexamined Patent Application Publication No. 2008-65319 can be suitably used as the material of the transparent resin filler 5b.

The material of the positive electrode layer 5 has a melting point higher than that of the material of the negative electrode layer 9 which will be described later. The material of the positive electrode layer 5 has a boiling point higher than that of the material of the negative electrode layer 9.

[Light Emitting Layer]

The light emitting layer 7 is generally mainly formed of an organic material emitting fluorescence and/or phosphorescence or an organic material and a dopant assisting the organic material. For example, a dopant may be added to improve emission efficiency or to change an emission wavelength. The organic material included in the light emitting layer 7 may be a low-molecular-weight compound or a high-molecular-weight compound. Examples of a light emitting material of the light emitting layer 7 include known pigment-based materials, metal complex-based materials, polymer-based materials, or dopant materials.

[Negative Electrode Layer]

A thin film formed of a metal oxide, a metal sulfide, a metal, or the like can be used as the negative electrode layer 9. As the negative electrode layer 9, for example, a thin film which is formed of indium oxide, zinc oxide, tin oxide, indium tin oxide (ITO), indium zinc oxide (IZO), gold, platinum, silver, magnesium, copper, or the like may be used. The negative electrode layer 9 may be formed of nanostructures such as silver nanoparticles or silver nanowires. The negative electrode layer 9 is electrically connected to an extraction electrode 9a.

[Sealing Layer]

The sealing layer 11 includes at least a metal foil and an adhesive layer. The sealing layer 11 has a gas barrier function and a moisture barrier function. The metal foil is an opaque substrate and examples thereof include an Al foil and a Cu foil. The adhesive layer bonds the sealing layer 11 to the negative electrode layer 9. The adhesive layer is disposed on the negative electrode layer 9 side. The sealing layer 11 covers the negative electrode layer 9. The sealing layer 11 may be a film in which a metal layer (such as an Al layer or a Cu layer) having a barrier property is stacked on a plastic film, or the like.

A method of manufacturing an organic EL element 1 having the above-mentioned configuration will be described below. When an organic EL element 1 is manufactured, first, the support substrate 3 is heated and then dried. Thereafter, the positive electrode layer 5, the light emitting layer 7, the negative electrode layer 9, and the sealing layer 11 are formed on the dried support substrate 3.

Figure 3:
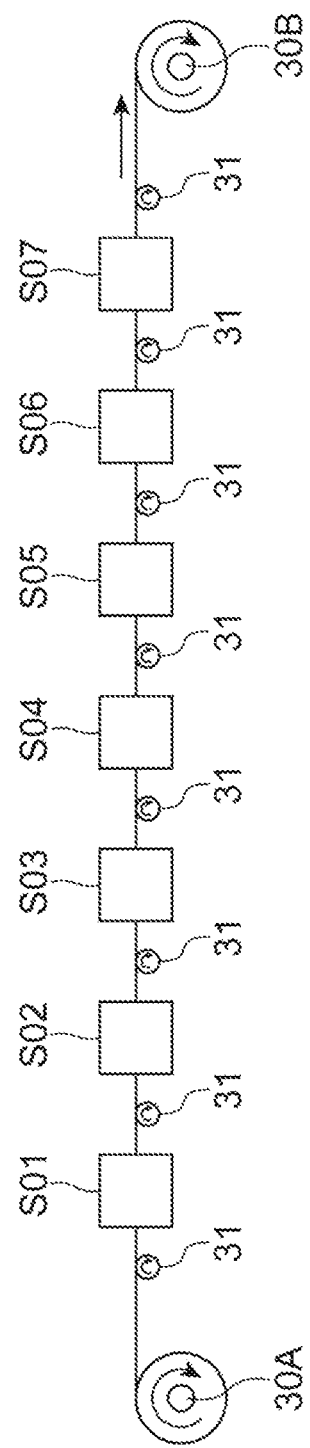
FIG. 3 is a diagram schematically illustrating a method of manufacturing an organic EL element using a roll-to-roll process.

When the support substrate 3 is a flexible substrate, a roll-to-roll process can be employed to manufacture the organic EL element 1 as illustrated in FIG. 3. When the organic EL element 1 is manufactured using a roll-to-roll process, various steps relevant to the manufacturing of the organic EL element 1 are performed while continuously conveying a long flexible support substrate 3 suspended between an unwinding roll 30A and a winding roll 30B using conveyance rollers 31.

[Substrate Drying Step]

First, the support substrate 3 is dried (a substrate drying step, Step S01). In the substrate drying step, for example, the support substrate 3 is dried such that there is equal to or less than 100 ppm of moisture contained in the support substrate 3. For example, a device that heats the support substrate 3 by irradiating the support substrate 3 with infrared light can be used to dry the support substrate 3.

[Positive Electrode Forming Step]

Then, the positive electrode layer 5 is formed on the support substrate 3 (a positive electrode forming step, Step S02). In the positive electrode forming step, the metal wire 5a is formed and then the transparent resin filler 5b is formed.

The metal wire 5a can be formed, for example, using a photolithography method. In this case, first, a metal layer which will be the metal wire 5a is formed using a physical vapor deposition (PVD) method and a sputtering method. Thereafter, the metal wire 5a is obtained by patterning the metal layer in a predetermined pattern using a photolithography method.

The metal wire 5a may be formed using a lift-off method. In this case, first, a mask in which an area in which the metal wire 5a in the predetermined pattern will be formed is open is formed. Thereafter, the metal wire is formed by depositing a metal in the open area of the mask using a physical vapor deposition method, a sputtering method, or the like. Subsequently, by removing the mask, the metal wire 5a in the predetermined pattern is obtained.

The metal wire 5a may be formed using various printing methods such as an ink jet printing method, a gravure printing method, and a screen printing method. In this case, ink in which nanostructures are dispersed are printed in the predetermined pattern of the metal wire 5a, for example, using an ink jet printing method. Thereafter, the metal wire 5a is obtained by baking the resultant.

The transparent resin filler 5b is formed by applying an application liquid including a transparent resin material which will be the transparent resin filler 5b onto the metal wire 5a. A solvent of the application liquid is not particularly limited as long as it can dissolve the transparent resin material, and examples thereof include diethylene glycol ethyl methyl ether, propylene glycol 1-monomethyl ether 2-acetate, 3-methoxybutyl acetate, 3-methoxy-1-butanol, and cyclohexanone.

Examples of the application method include a slot die method, a casting method, a microgravure coating method, a gravure coating method, a bar coating method, a roll coating method, a wire bar coating method, a dip-coating method, a spray coating method, a screen printing method, a flexographic printing method, an offset printing method, and an ink jet printing method.

After a resin film is formed on the metal wire 5a by applying a transparent resin material onto the metal wire 5a, the resin film is thermally cured, for example, by performing a thermosetting process, a development process, and a heating process on the resin film and thus the transparent resin filler 5b is formed. Accordingly, the opening portions 6 which are defined by the metal wire 5a are filled with the transparent resin filler 5b and thus the positive electrode layer 5 is formed.

In addition to polymerizable resin compounds described in Japanese Unexamined Patent Application Publication No. 2008-65319, organic materials having conductivity can be used as the material of the transparent resin filler 5b.

[Light Emitting Layer Forming Step]

Subsequently, the light emitting layer 7 is formed on the positive electrode layer 5 (a light emitting layer forming step, Step S03). The light emitting layer 7 is formed of pigment-based materials, metal complex-based materials, polymer-based materials, or dopant materials as described above.

Examples of the pigment-based materials include cyclopentamine and derivatives thereof, tetraphenyl butadiene and derivatives thereof, triphenyl amine and derivatives thereof, oxadiazole and derivatives thereof, pyrazoloquinoline and derivatives thereof, distyrylbenzene and derivatives thereof, distyrylarylene and derivatives thereof, pyrrole and derivatives thereof, thiophene compounds, pyridine compounds, perinone and derivatives thereof, perylene and derivatives thereof, oligothiophene and derivatives thereof, oxadiazole dimer, pyrazoline dimer, quinacridone and derivatives thereof and coumarin and derivatives thereof.

Examples of the metal complex-based materials include metal complexes having a rare-earth metal such as Tb, Eu, or Dy or Al, Zn, Be, Ir, or Pt as a center metal and oxadiazole, thiadiazole, phenyl pyridine, phenyl benzimidazole, or a quinolone structure as a ligand.

Examples of the polymer-based materials include polyparaphenylene vinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinyl carbazole and derivatives thereof, and products obtained by polymerizing these pigment-based materials or these metal complex-based materials.

Examples of the materials emitting blue light among the light emitting materials include distyrylarylene and derivatives thereof, oxadiazole, derivatives thereof, and polymers thereof, polyvinyl carbazole and derivatives thereof, polyparaphenylene and derivatives thereof, and polyfluorene and derivatives thereof.

Examples of the materials emitting green light include quinacridone and derivatives thereof, coumarin, derivatives thereof, and polymers thereof, polyparaphenylene vinylene and derivatives thereof, and polyfluorene and derivatives thereof.

Examples of the materials emitting red light include cumarin and derivatives thereof, thiophene compounds and polymers thereof, polyparaphenylene vinylene and derivatives thereof, polythiophene and derivatives thereof, and polyfluorene and derivatives thereof.

Examples of the dopant materials include perylene and derivatives thereof, coumarin and derivatives thereof, rubrene and derivatives thereof, quinacridone and derivatives thereof, squarylium and derivatives thereof, porphyrin and derivatives thereof, styryl-based pigments, tetracene and derivatives thereof, pyrazolone and derivatives thereof, decacyclene and derivatives thereof, and phenoxazone and derivatives thereof.

The light emitting layer 7 can be formed using a vapor deposition method or an application method. Examples of the application method include coating methods such as a spin coating method, a casting method, a microgravure coating method, a gravure coating method, a bar coating method, a roll coating method, a wire bar coating method, a dip coating method, a slit coating method, a capillary coating method, a spray coating method, and a nozzle coating method, and printing methods such as a gravure printing method, a screen printing method, a flexographic printing method, an offset printing method, a reverse printing method, and an ink jet printing method. When pattern application is necessary, the light emitting layer 7 is formed using an application method enabling pattern application, and is particularly preferably formed using an ink jet printing method.

A solvent of ink (an application liquid) which is used for an application method is not particularly limited as long it can dissolve various materials, and examples thereof include fluorine-based solvents such as chloroform, methylene chloride, and dichloroethane, ether-based solvents such as tetrahydrofuran, aromatic hydrocarbon-based solvents such as toluene and xylene, ketone-based solvents such as acetone and methylethyl ketone, ester-based solvents such as ethyl acetate, butyl acetate, and ethyl cellosolve acetate, and water.

[Negative Electrode Layer Forming Step]

Subsequently, the negative electrode layer 9 is formed on the light emitting layer 7 (a negative electrode layer forming step, Step S04). The negative electrode layer 9 can be formed using a vapor deposition method or an application method similar to those for the light emitting layer 7. Materials with a small work function, allowing easy injection of electrons into the light emitting layer 7, and with high electrical conductivity are preferably used as the material of the negative electrode layer 9. In the organic EL element 1 having a configuration in which light is emitted from the positive electrode layer 5 side (the principal surface 3b of the support substrate 3 serves as a light emitting surface), materials with high reflectance of visible light are preferably used as the material of the negative electrode layer 9 in order to reflect light emitted from the light emitting layer 7 to the positive electrode layer 5 using the negative electrode layer 9. For example, an alkali metal, an alkaline earth metal, a transition element, or a metal belonging to group 13 of the periodic table can be used for the negative electrode layer 9. When the negative electrode layer 9 is formed using a vapor deposition method, the negative electrode layer 9 preferably include at least one of aluminum, silver, and magnesium. When the negative electrode layer 9 is formed using an application method, the negative electrode layer 9 preferably includes nanostructures like silver nanostructures such as silver nanoparticles and silver nanowires.

[Step of Inspecting for Defects]

Figure 4:
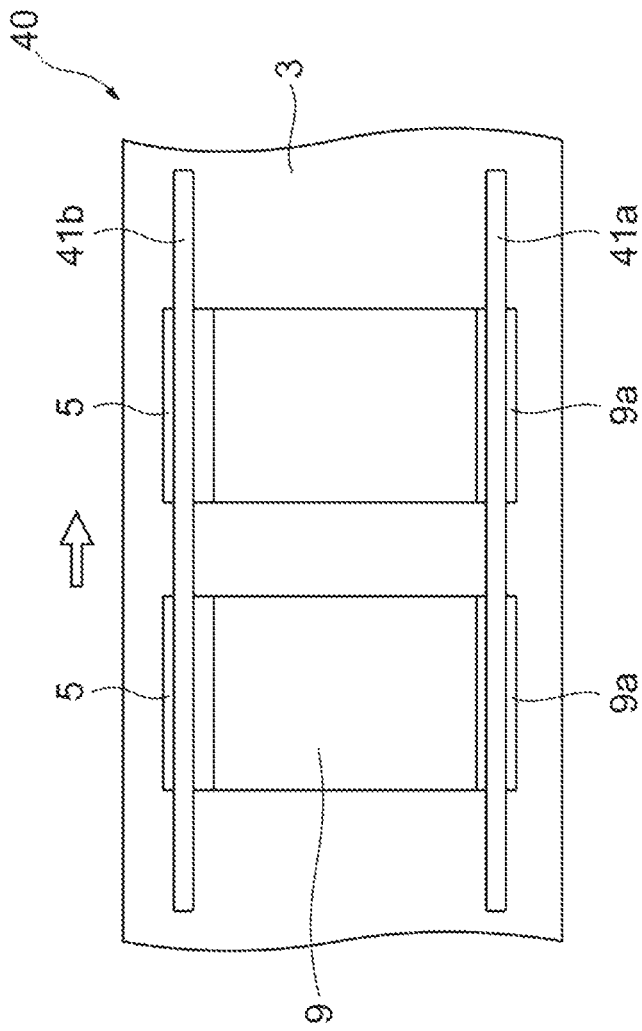
FIGS. 4(A) and 4(B) are diagrams illustrating an inspection device.
Figure 4B:
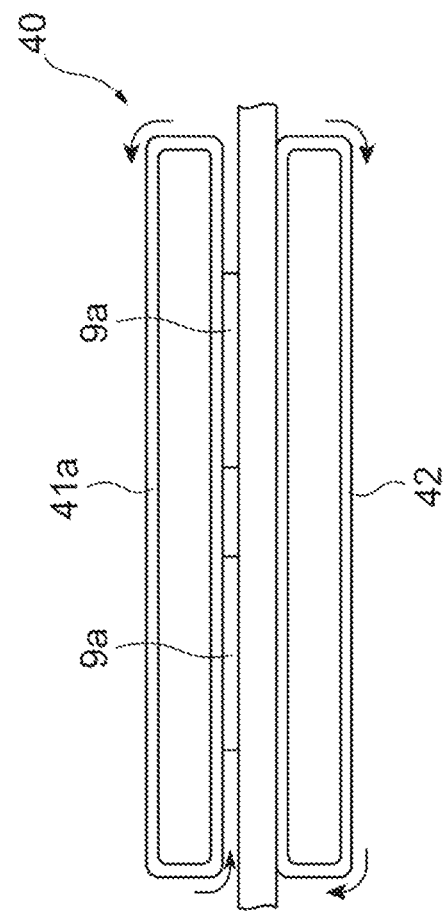

Then, inspection for defects is performed (a step of inspecting for defects, Step S05). In the defect inspecting step, the light emitting layer 7 is caused to emit light by applying a voltage to the positive electrode layer 5 and the negative electrode layer 9 and then defects are inspected for. Here, a defect refers to a pixel defect due to a short circuit between the positive electrode layer 5 and the negative electrode layer 9. As illustrated in FIGS. 4(A) and 4(B), an inspection device 40 includes contact belts (an application unit) 41a and 41b and a pressing belt (a support unit) 42. The contact belts 41a and 41b are connected to a power supply which is not illustrated. The contact belt 41a comes in contact with an extraction electrode 9a that is electrically connected to the negative electrode layer 9. The contact belt 41b comes in contact with the positive electrode layer 5. The contact belts 41a and 41b apply a voltage to the positive electrode layer 5 and the negative electrode layer 9.

The pressing belt 42 supports the support substrate 3. The pressing belt 42 brings the contact belt 41a into contact with the extraction electrode 9a and brings the contact belt 41b into contact with the positive electrode layer 5. The inspection device 40 applies a voltage to the positive electrode layer 5 and the negative electrode layer 9 to inspect for defects while supporting the support substrate 3.

More specifically, the inspection device 40 includes an imaging unit (for example, a camera) that is disposed below the support substrate 3 which is conveyed and images the light emitting layer 7. The inspection device 40 detects a defective portion on the basis of an image of the light emitting layer 7 captured by the imaging unit. A known techniques can be employed as an inspection method of inspecting for defects based on an image.

[Defect Removing Step]

Figure 5:
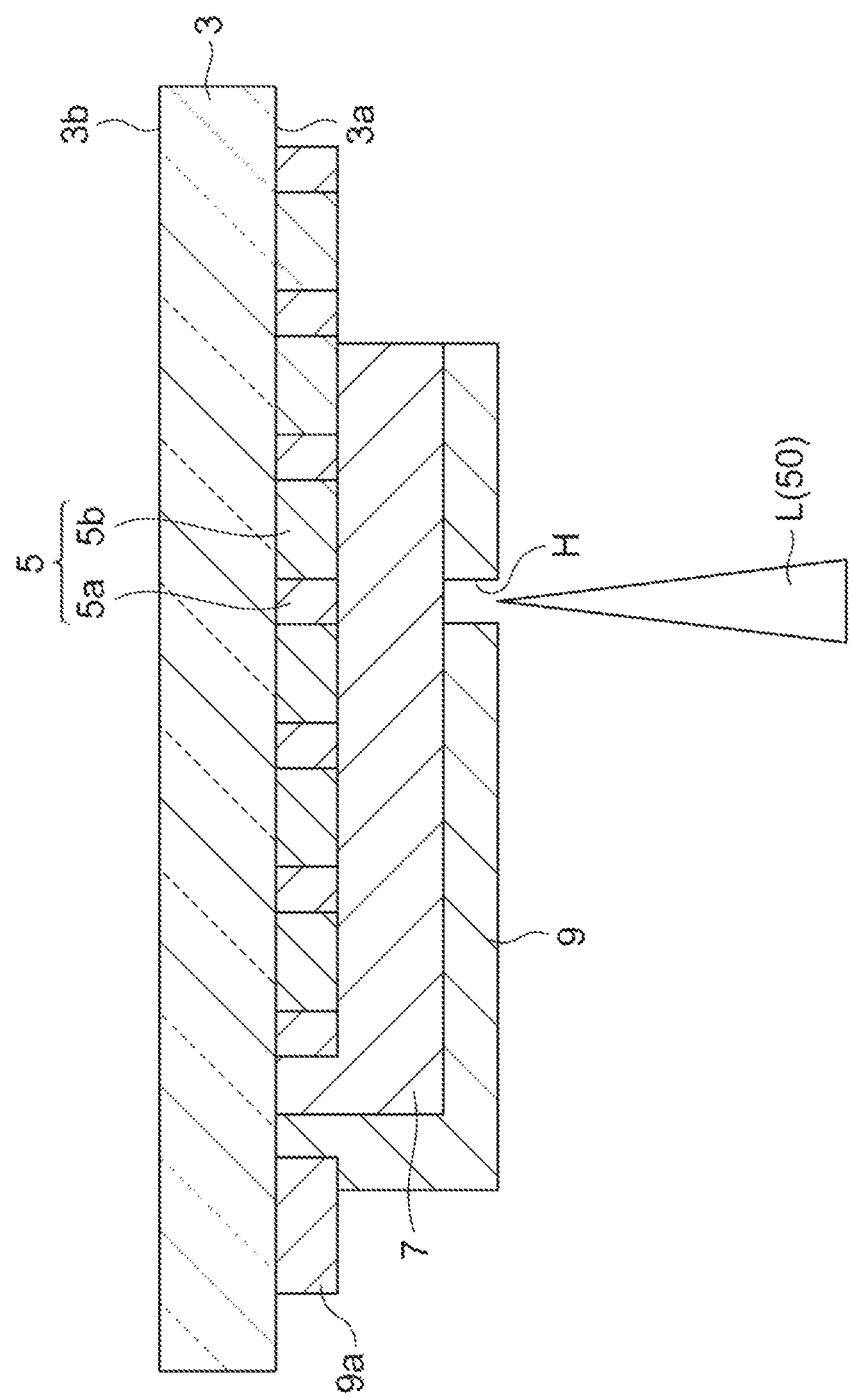
FIG. 5 is a diagram illustrating a defect removing step.

Subsequently, when a defect is detected, the negative electrode layer 9 in the defective portion is removed (a defect removing step, Step S06). In the defect removing step, the negative electrode layer 9 in the defective portion which has been detected in the defect inspecting step is removed. Specifically, a defect removing device 50 includes a laser beam irradiation unit that applies a laser beam L as illustrated in FIG. 5. The wavelength of the laser beam L ranges, for example, from 0.19 μm to 10.6 μm.

Figure 6:
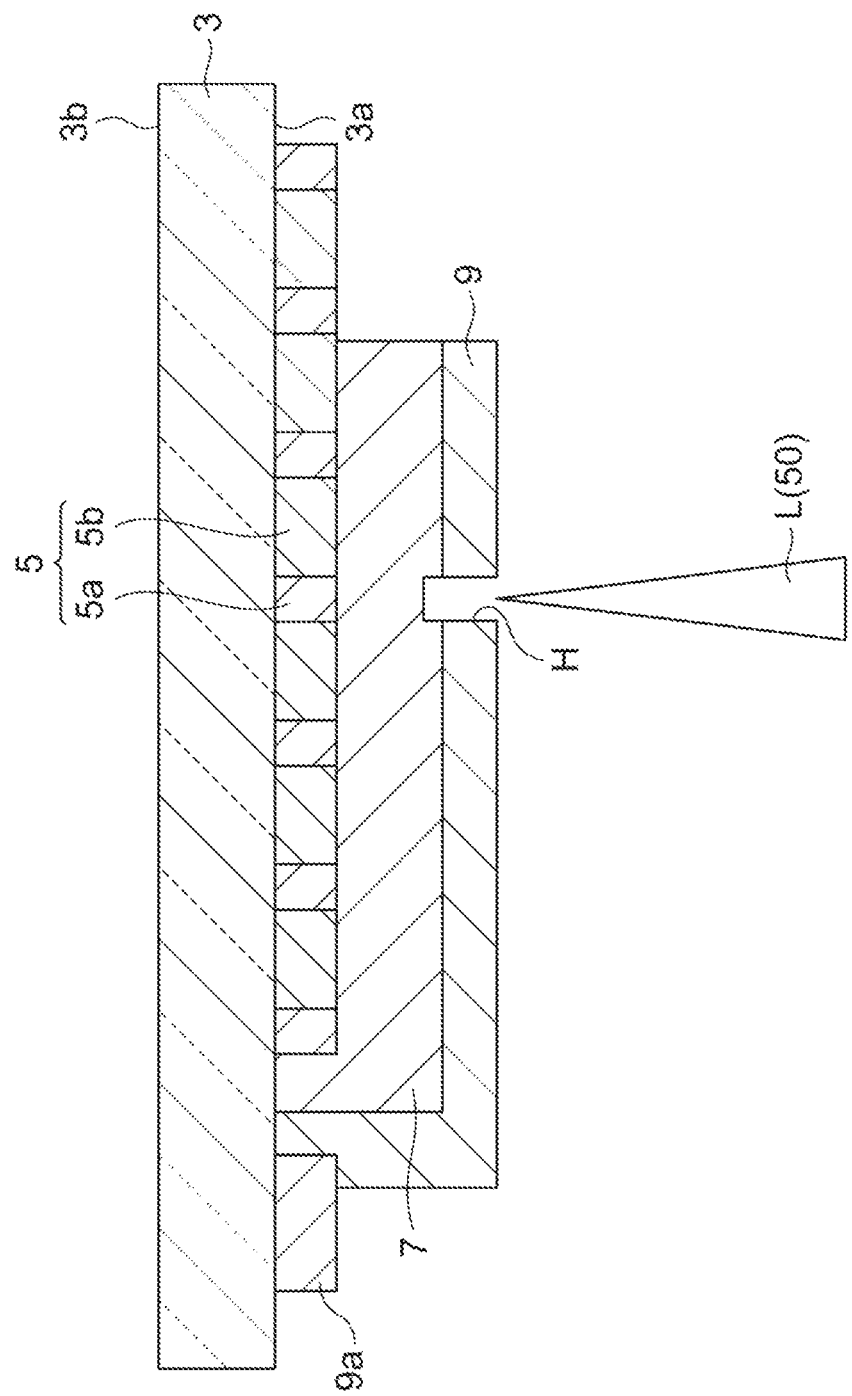
FIG. 6 is a diagram illustrating a defect removing step.

The defect removing device 50 irradiates the negative electrode layer 9 with the laser beam L and removes the negative electrode layer 9 in the defective portion by laser ablation. The defective portion may include an area surrounding the defective portion. The laser beam L is applied from the negative electrode layer 9 side. In this embodiment, in the defect removing step, the support substrate 3 is conveyed such that the negative electrode layer 9 is located below the support substrate 3 as illustrated in FIGS. 5 and 6. That is, up to Step S05 illustrated in FIG. 3, the support substrate 3 is conveyed such that the support substrate 3 is located lower, and a conveyance path is set such that the support substrate 3 is located upper in Step S06. The laser beam L is applied to the negative electrode layer 9 which is located upper from the lower side. In the environment in which the defect removing step is performed by the defect removing device 50, a dew point is preferably equal to or lower than −50° C. (in the atmosphere of nitrogen or the atmosphere of dry air).

In the defect removing step, only the negative electrode layer 9 in the defective portion may be removed as illustrated in FIG. 5, or the negative electrode layer 9 and a part of the light emitting layer 7 may be removed as illustrated in FIG. 6. A recessed portion H is formed in the part from which the negative electrode layer 9 has been removed. Since at least the negative electrode layer 9 in the defective portion is removed, the positive electrode layer 5 and the negative electrode layer 9 are electrically isolated from each other, and the short circuit between the positive electrode layer 5 and the negative electrode layer 9 is removed.

[Sealing Layer Forming Step]

Subsequently, the sealing layer 11 is formed on the negative electrode layer 9 (a sealing layer forming step, Step S07). In the sealing layer forming step, the sealing layer 11 is bonded onto the negative electrode layer 9. Specifically, the sealing layer 11 provided with an adhesive layer having a thermosetting property is prepared, and the sealing layer 11 is disposed on the negative electrode layer 9 such that the adhesive layer is located on the negative electrode layer 9 side to cover the negative electrode layer 9. Thereafter, the adhesive layer of the sealing layer 11 is thermally cured to bond the sealing layer 11 to the negative electrode layer 9. The recessed portion H which is formed in the negative electrode layer 9 in the defect removing step is embedded by the adhesive layer by forming the sealing layer 11 as illustrated in FIG. 1. The sealing layer 11 may be formed of a thermoplastic sheet. In this case, the sheet is heated and pressurized and thus the sealing layer 11 is formed and bonded to the negative electrode layer 9.

As described above, in the method of manufacturing the organic EL element 1 according to the embodiment, a part of the negative electrode layer 9 is removed by irradiating the negative electrode layer 9 in the defective portion with a laser beam L before forming the sealing layer 11 including a metal foil. At this time, the laser beam L is applied from the negative electrode layer 9 side. Accordingly, in this manufacturing method, a situation in which the laser beam L is reflected by the metal wire 5a of the positive electrode layer 5 with a network structure and the negative electrode layer 9 in the defective portion is not irradiated with the laser beam L does not occur. Accordingly, it is possible to appropriately irradiate the negative electrode layer 9 in the defective portion with the laser beam L and to satisfactorily remove the negative electrode layer 9. As a result, in the method of manufacturing the organic EL element 1, it is possible to satisfactorily correct the defective portion. Since the sealing layer 11 is formed after the negative electrode layer 9 has been removed, the recessed portion H which has been formed by the removal can be embedded by the sealing layer 11.

In the method of manufacturing the organic EL element 1 according to the embodiment, the metal wire 5a forms the positive electrode layer 5 having a lattice-shaped pattern. When the metal wire 5a constituting a network structure has a lattice-shaped pattern and a laser beam L is applied from the positive electrode layer 5 side, there is a high likelihood that the laser beam L will be reflected by the metal wire 5a. Accordingly, the method of applying the laser beam L from the negative electrode layer 9 side is particularly effective in the network structure having a lattice-shaped pattern.

In the method of manufacturing the organic EL element 1 according to the embodiment, the positive electrode layer 5 is formed using a material having a melting point higher than that of the material of the negative electrode layer 9. The positive electrode layer 5 is formed using a material having a boiling point higher than that of the material of the negative electrode layer 9. According to this configuration, it is possible to curb damage to the positive electrode layer 5 due to irradiation with a laser beam L. Accordingly, it is possible to prevent a decrease in reliability of the organic EL element 1.

In the method of manufacturing the organic EL element 1 according to the embodiment, the support substrate 3 has flexibility and the steps associated with the manufacturing are performed using a roll-to-roll process. By employing the roll-to-roll process, it is possible to efficiently perform the steps.

In the defect inspecting step of the method of manufacturing the organic EL element 1 according to the embodiment, a defective portion is detected by pinching the support substrate 3, the positive electrode layer 5, and the negative electrode layer 9 using the pressing belt 42 that supports the support substrate 3 and the contact belts 41a and 41b that apply a voltage to the positive electrode layer 5 and the negative electrode layer 9 and causing the light emitting layer 7 to emit light. Accordingly, the support substrate 3 having flexibility can be supported without being bent. Since the support substrate 3, the positive electrode layer 5, and the negative electrode layer 9 are pinched by the pressing belt 42 and the contact belts 41a and 41b, it is possible to satisfactorily apply a voltage to the positive electrode layer 5 and the negative electrode layer 9 using the contact belts 41a and 41b. Accordingly, it is possible to satisfactorily cause the light emitting layer 7 to emit light and to detect a defective portion satisfactorily.

In the method of manufacturing the organic EL element 1 according to the embodiment, the environmental dew point when the negative electrode layer 9 is irradiated with a laser beam L is equal to or lower than −50° C. In this way, by irradiating the negative electrode layer 9 with a laser beam L in the atmosphere of nitrogen or in the atmosphere of dry air, it is possible to satisfactorily remove the negative electrode layer 9.

In the method of manufacturing the organic EL element 1 according to the embodiment, the negative electrode layer 9 and a part of the light emitting layer 7 in a defective portion are removed by a laser beam L. Accordingly, the negative electrode layer 9 in the defective portion is satisfactorily removed as illustrated in FIG. 6. Accordingly, it is possible to correct a defective portion due to a short circuit between the positive electrode layer 5 and the negative electrode layer 9.

In the method of manufacturing the organic EL element 1 according to the embodiment, the negative electrode layer 9 is irradiated with a laser beam L from the lower side in a state in which the negative electrode layer 9 is located below the support substrate 3. Accordingly, substance removed by irradiation with the laser beam L can drop down. As a result, it is possible to prevent the removed substrate from remaining in the recessed portion H formed in the negative electrode layer 9.

The invention is not limited to the above-mentioned embodiment and can be modified in various forms. For example, in the embodiment, the organic EL element 1 in which the light emitting layer 7 is disposed between the positive electrode layer 5 and the negative electrode layer 9 has been described. However, the configuration of the organic functional layer is not limited thereto. The organic functional layer may have the following configurations.

(a) positive electrode layer/light emitting layer/negative electrode layer (b) positive electrode layer/hole injection layer/light emitting layer/negative electrode layer (c) positive electrode layer/hole injection layer/light emitting layer/electron injection layer/negative electrode layer (d) positive electrode layer/hole injection layer/light emitting layer/electron transport layer/electron injection layer/negative electrode layer (e) positive electrode layer/hole injection layer/hole transport layer/light emitting layer/negative electrode layer (f) positive electrode layer/hole injection layer/hole transport layer/light emitting layer/electron injection layer/negative electrode layer (g) positive electrode layer/hole injection layer/hole transport layer/light emitting layer/electron transport layer/electron injection layer/negative electrode layer (h) positive electrode layer/light emitting layer/electron injection layer/negative electrode layer (i) positive electrode layer/light emitting layer/electron transport layer/electron injection layer/negative electrode layer Here, a symbol "/" means that layers before and after the symbol "/" are stacked adjacent to each other. The configuration described in (a) is the configuration of the organic EL element 1 according to the embodiment.

Known materials can be used as the materials of the hole injection layer, the hole transport layer, the electron transport layer, and the electron injection layer. The hole injection layer, the hole transport layer, the electron transport layer, and the electron injection layer can be formed, for example, using an application method similarly to the light emitting layer 7.

The organic EL element 1 may have the light emitting layer 7 of a single layer or may have the light emitting layer 7 of two or more layers. In any of the layer configurations (a) to (i), when a stacked structure which is disposed between the positive electrode layer 5 and the negative electrode layer 9 is defined as "structure unit A," a layer configuration described in (j) below can be exemplified as the configuration of the organic EL element including the light emitting layer 7 of two layers. The layer configurations of two layers (structure units A) may be the same or may be different from each other.

(j) positive electrode layer/(structure unit A)/charge generation layer/(structure unit A)/negative electrode layer Here, the charge generation layer is a layer that generates holes and electrons by application of an electric field thereto. Examples of charge generation layer include thin films formed of vanadium oxide, ITO, or molybdenum oxide.

When "(structure unit A)/charge generation layer" is defined as "structure unit B," a layer configuration described in (k) below can be exemplified as the configuration of the organic EL element including three or more light emitting layers.

(k) positive electrode layer/(structure unit B)x/(structure unit A)/negative electrode layer The symbol "x" denotes an integer which is equal to or greater than 2, and "(structure unit B)x" denotes a stacked body in which x stages of (structure unit B) are stacked. The layer configurations of (structure units B) may be the same or may be different from each other.

The organic EL element may be constituted by directly stacking a plurality of light emitting layers 7 instead of forming the charge generating layer.

In the above-mentioned embodiment, an example in which the positive electrode layer 5 is formed on the support substrate 3 using a roll-to-roll process has been described. However, the positive electrode layer 5 may be formed on the support substrate 3 in advance and the steps for manufacturing the organic EL element 1 may be performed while continuously conveying the long support substrate 3 on which the positive electrode layer 5 has been formed and which is suspended between the unwinding roll 30A and the winding roll 30B using the conveyance rollers 31.

Hitherto, various embodiments of the invention have been described above. However, the invention is not limited to the embodiments and can be modified in various forms without departing from the gist of the invention.

REFERENCE SIGNS LIST

1 Organic EL element
3 Support substrate (substrate)
5 Positive electrode layer (first electrode layer)
5a Metal wire (conductor)
7 Light emitting layer (organic functional layer)
9 Negative electrode layer (second electrode layer)
11 Sealing layer
L Laser beam

The invention claimed is:

1. A method of manufacturing an organic EL element in which a substrate, a first electrode layer having a conductor with a network structure, an organic functional layer, a second electrode layer, and a sealing layer including an opaque substrate are arranged in this order, the method comprising:

a step of forming the first electrode layer, the organic functional layer, and the second electrode layer on the substrate;

a step of detecting a defective portion due to a short circuit between the first electrode layer and the second electrode layer after forming the second electrode layer;

a step of removing the second electrode layer in the defective portion by irradiating the defective portion with a laser beam from the second electrode layer side when the defective portion has been detected; and a step of forming the sealing layer after removing the second electrode layer in the defective portion, wherein the first electrode layer is formed using a material having a melting point higher than that of a material of the second electrode layer, thereby mitigating decline in reliability of the organic EL element.

2. The method of manufacturing an organic EL element according to claim 1, wherein the first electrode layer in which the conductor has a lattice-shaped pattern is formed.

3. The method of manufacturing an organic EL element according to claim 1, wherein the first electrode layer is formed using a material having a boiling point higher than that of a material of the second electrode layer.

4. The method of manufacturing an organic EL element according to claim 1, wherein the substrate has flexibility, and wherein the steps are performed while continuously conveying the substrate.

5. The method of manufacturing an organic EL element according to claim 1, wherein the defective portion is detected in the step of detecting the defective portion by pinching the substrate, the first electrode layer, and the second electrode layer using a support unit that supports the substrate and an application unit that applies a voltage to the first electrode layer and the second electrode layer and causing the organic functional layer to emit light.

6. The method of manufacturing an organic EL element according to claim 1, wherein the substrate is a film having a barrier layer or a thin-film glass.

7. The method of manufacturing an organic EL element according to claim 1, wherein an environmental dew point when the second electrode layer is irradiated with the laser beam is equal to or lower than −50° C.

8. The method of manufacturing an organic EL element according to claim 1, wherein the second electrode layer and a part of the organic functional layer in the defective portion are removed using the laser beam.

9. The method of manufacturing an organic EL element according to claim 1, wherein the second electrode layer is irradiated with the laser beam from a lower side in a state in which the second electrode layer is located below the substrate.

* * * * *